(12) United States Patent
Park et al.

(10) Patent No.: US 6,747,900 B1
(45) Date of Patent: Jun. 8, 2004

(54) MEMORY CIRCUIT ARRANGEMENT FOR PROGRAMMING A MEMORY CELL

(75) Inventors: Sheunghee Park, Pleasanton, CA (US); Ming Sang Kwan, San Leandro, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/348,732

(22) Filed: Jan. 21, 2003

(51) Int. Cl.[7] .............................................. G11C 16/04
(52) U.S. Cl. ............................ 365/185.28; 365/185.18; 365/185.26
(58) Field of Search ....................... 365/185.28, 185.18, 365/185.26, 185.01, 185.27

(56) References Cited

U.S. PATENT DOCUMENTS 6,243,298 B1 * 6/2001 Lee et al. .............. 365/185.28

* cited by examiner

*Primary Examiner*—David Lam
(74) *Attorney, Agent, or Firm*—Farjami & Farjami LLP

(57) ABSTRACT

A memory circuit for programming a target cell is disclosed. According to one embodiment, the memory circuit comprises the target cell having a drain terminal connected to a bit line. A drain voltage is coupled to the bit line and supplies a voltage greater than a ground voltage, while a gate voltage is coupled to a gate terminal of the target cell and supplies a voltage greater the ground voltage. A source voltage is coupled to a source terminal of the target cell and supplies a voltage less than the ground voltage, and a substrate voltage is coupled to a substrate of the target cell and supplies a voltage less than the ground voltage.

20 Claims, 4 Drawing Sheets

MEMORY CIRCUIT ARRANGEMENT FOR PROGRAMMING A MEMORY CELL

1. Technical Field

The present invention relates generally to the field of semiconductor devices. More particularly, the present invention relates to semiconductor memory devices.

2. Background Art

Memory devices are known in the art for storing electronic data in a wide variety of electronic devices and applications. Electronic memory, for example, is widely used in a variety of commercial and consumer electronic products. A typical memory device comprises a plurality of memory cells. Often, memory cells are arranged in an array format, where a row of memory cells corresponds to a word line, and a column of memory cells corresponds to a bit line, and where each memory cell defines a binary bit, i.e., either a zero ("0") bit or a one ("1") bit. For example, a memory cell may be defined as either being a "programmed" cell or an "erased" cell. According to one particular convention, a programmed cell is representative of a "0" bit, and an erased cell is representative of a "1" bit. Typically, the state of a memory cell is determined during a "read" operation by sensing the magnitude of the current drawn by the memory cell, where, for example, a low current draw indicates a "programmed" cell (corresponding to a "0" bit) and a high current draw indicates an "erased" cell (corresponding to a "1" bit).

A typical memory cell may be formed on a semiconductor substrate. For example, a floating gate memory cell comprises an N-type source region formed within a P-type substrate, an N-type drain region formed within the P-type substrate and spaced apart from the source region, a channel region interposed between the source and the drain regions, a floating gate insulated from and spaced a short distance above the channel, and a control gate insulated from and disposed above the floating gate.

According to conventional operation, a memory cell is "programmed" by inducing high energy electron injection onto the floating gate. Electron injection carries negative charge into the floating gate. This injection mechanism is normally induced by connecting the source region and the substrate to ground, applying a high positive voltage to the control gate and applying a high positive voltage to the drain region. The voltage supplied to the control gate creates an electron attracting field while the voltage supplied to the drain region generates high energy electrons, which are attracted to and negatively charge the floating gate. The accumulation of negative charge in the floating gate raises the negative potential of the floating gate, which raises the threshold voltage of the memory cell and reduces current drawn by the memory cell during subsequent read operations, thereby indicating a "programmed" cell (corresponding to a "0" bit).

A number of drawbacks are associated with the conventional approach of programming memory cells. For example, because of the high voltages required for programming a memory cell, large charge pumps may be required in order to supply the requisite high voltages. Large charge pumps have the disadvantage of requiring larger silicon areas in the memory device, thereby increasing fabrication costs and increasing device size, both of which are undesirable. Accordingly, there exists a strong need in the art to overcome deficiencies of conventional memory circuits, such as those described above, for quickly and reliably programming memory cells and for reducing the voltage requirements during programming operations.

SUMMARY

The present invention is directed to a memory circuit arrangement for programming a memory cell. The present invention results in quick and reliable programming of memory cells while reducing voltage requirements during programming operations. According to one exemplary embodiment, a memory circuit comprises a target cell having a drain terminal connected to a bit line, where, for example, a programming operation involving the target cell is to be performed. The target cell may for example, comprise a floating gate memory cell. In the exemplary embodiment, a drain voltage is coupled to the bit line and supplies a voltage greater than the ground voltage, while a gate voltage is coupled to a gate terminal of the target cell and also supplies a voltage greater the ground voltage. A source voltage is coupled to a source terminal of the target cell and supplies a voltage less than the ground voltage, and a substrate voltage is coupled to a substrate of the target cell and also supplies a voltage less than the ground voltage. According this exemplary embodiment, the drain voltage, gate voltage, source voltage, and substrate voltage cause electrons to be generated and attracted to a floating gate of the target cell. As a result, the target cell is programmed. However, since the source and substrate voltages are below the ground voltage, the high voltage requirements at the drain terminal of the target cell for programming the target cell are reduced, when compared to conventional configurations.

In one particular embodiment, the substrate voltage is less than the source voltage. For example, in one embodiment, the substrate voltage is approximately −3 V, while the source voltage is approximately −2 V. In this embodiment, the memory circuit further comprises an unselected cell having a drain terminal connected the bit line. The source terminal of the unselected cell is coupled to the source voltage, while the gate terminal of the unselected cell is connected to ground. The substrate of the unselected cell is also connected to the substrate voltage. According this exemplary embodiment, the difference between the substrate voltage and the source voltage causes the threshold voltage of the unselected cell to be greater than the gate-to-source voltage of the unselected cell. As a result, the unselected cell does not draw current from the bit line, thereby reducing or eliminated leakage current along the bit line during programming of the target cell.

Other features and advantages of the present invention will become more readily apparent to those of ordinary skill in the art after reviewing the following detailed description and accompanying drawings.

DETAILED DESCRIPTION OF THE INVENTION

The present invention is directed to a memory circuit arrangement for programming a memory cell. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. In the present application, a memory cell on which a programming operation is to be performed may be referred to as a "target cell," while memory cells other than the "target cell" may be referred herein to as "unselected cells."

Figure 1:
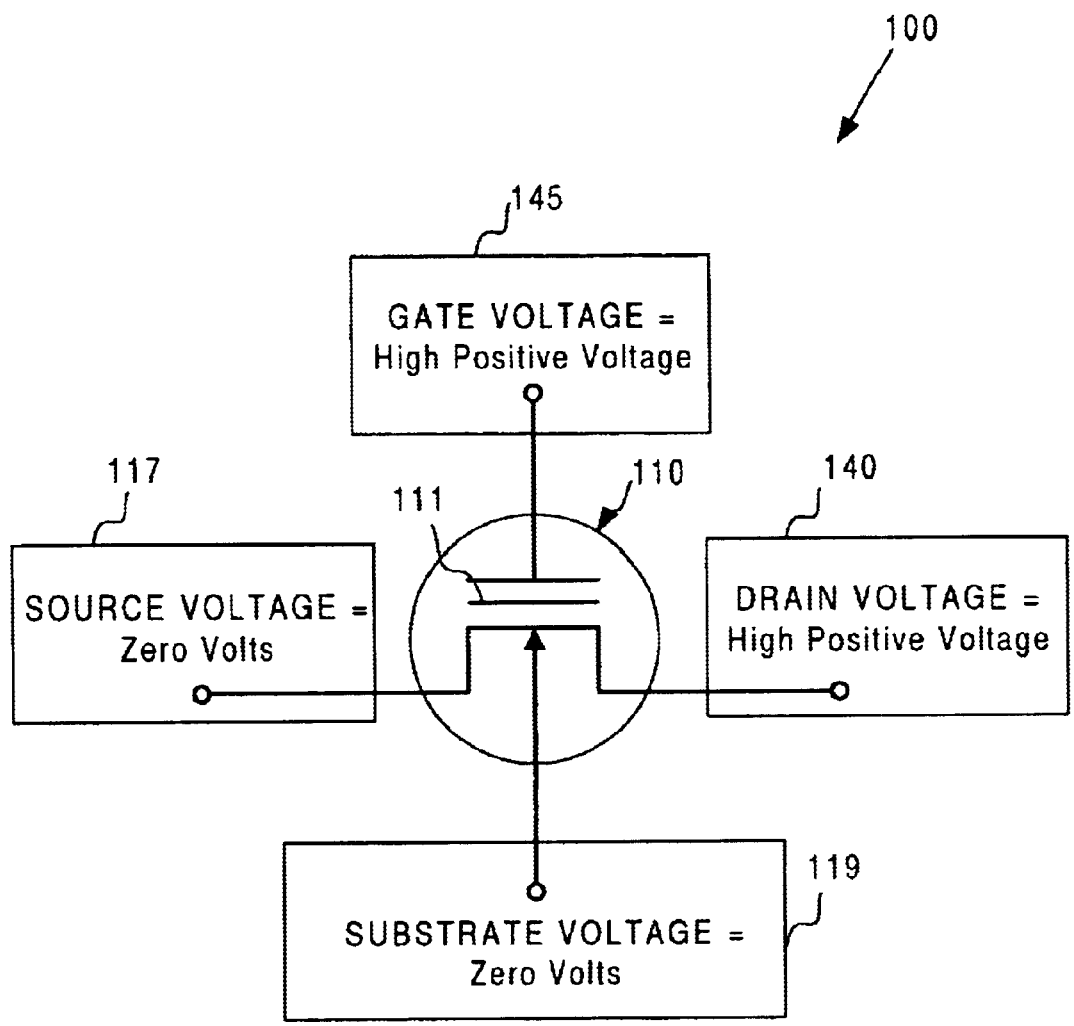
FIG. 1 depicts a known circuit configuration for programming a memory cell.
Figure 2:
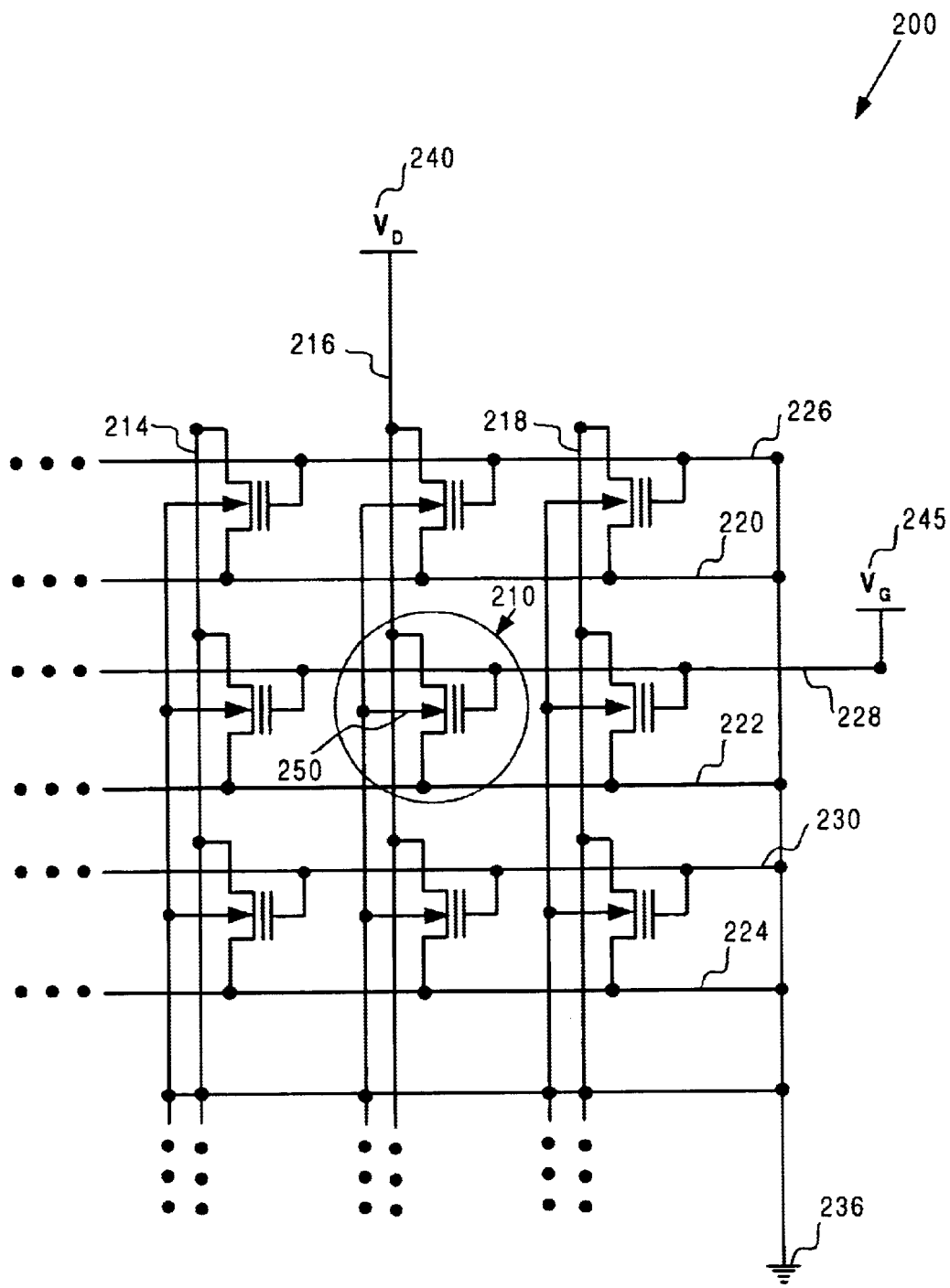
FIG. 2 depicts a schematic of a known memory circuit for programming a memory cell.

To illustrate the features and advantages of the present invention by way of contrast, a brief description of a known circuit configuration and a known memory circuit for programming a target cell is provided with reference to FIGS. 1 and 2. Referring first to FIG. 1, known circuit configuration 100 for programming target cell 110 is shown. Target cell 110 may, for example, be a flash memory cell having a floating gate 111. In circuit configuration 100, gate voltage 145 is supplied to the gate of target cell 110, and drain voltage 140 is supplied to the drain terminal of target cell 110. Gate voltage 145 supplies a high positive voltage, e.g., about 10 volts (V) while drain voltage 140 also supplies a high positive voltage, e.g., about 5 V. The source terminal of target cell 110 and the substrate of target cell 110 are coupled to ground, and thus each of the source voltage 117 and the substrate voltage 119 is 0 V.

Gate voltage 145 supplied to the gate of target cell 110 creates an electron attracting field, and drain voltage 140 supplied to the drain terminal of target cell 110 results in a flow of high energy electrons which are attracted to, and negatively charge, floating gate 111, raising the negative potential of floating gate 111 and the threshold voltage ($V_T$) of target cell 110. As described above, raising the $V_T$ of target cell 110 reduces the magnitude of the current drawn by target cell 110 during subsequent read operations, thereby indicating a "programmed" cell.

Referring next to FIG. 2, there is shown a schematic of known memory circuit 200 for a programming operation involving target cell 210. Target cell 210 and memory circuit 200 may be part of a larger memory array (not shown in FIG. 2). The connections shown in FIG. 2 may be established by one or more selection circuits (not shown). In memory circuit 200, target cell 210 has a drain terminal connected to a drain voltage ("$V_D$") 240 via bit line 216. The gate of target cell 210 is connected to a word line 228 which is supplied a gate voltage ("$V_G$") 245. The source terminal of target cell 210 is coupled to ground 236 via line 222. "Substrate" 250 (i.e. "body" 250) of target cell 210 is also coupled to ground 236. $V_D$ 240 supplies a high positive voltage, e.g., about 5 V, and $V_G$ 245 also supplies a high positive voltage, e.g., about 10 V.

The unselected cells of known memory circuit 200 are disabled during programming of target cell 210. Thus, word lines 226 and 230 connected to respective gates of the unselected cells are coupled to ground 236. As shown in memory circuit 200, bit lines 214 and 218 are connected to respective drain terminals of the unselected cells. The source terminals and "substrates" (i.e. "bodies") of each of the memory cells in memory circuit 200 are also connected to ground 236. With the connections established as shown in FIG. 2, target cell 210 can be programmed independently from the unselected cells of memory circuit 200 in the manner as described above in conjunction with FIG. 1.

A particular drawback associated with known circuit configuration 100 and known memory circuit 200, however, is the requirement for the high positive voltage at the drain terminal of target cells 110 and 210. As pointed out above, a high voltage necessitates a large charge pump, which in turn requires consumption of a large silicon area in the memory device, resulting in increased fabrication costs and increased device size, which are undesirable.

Figure 3:
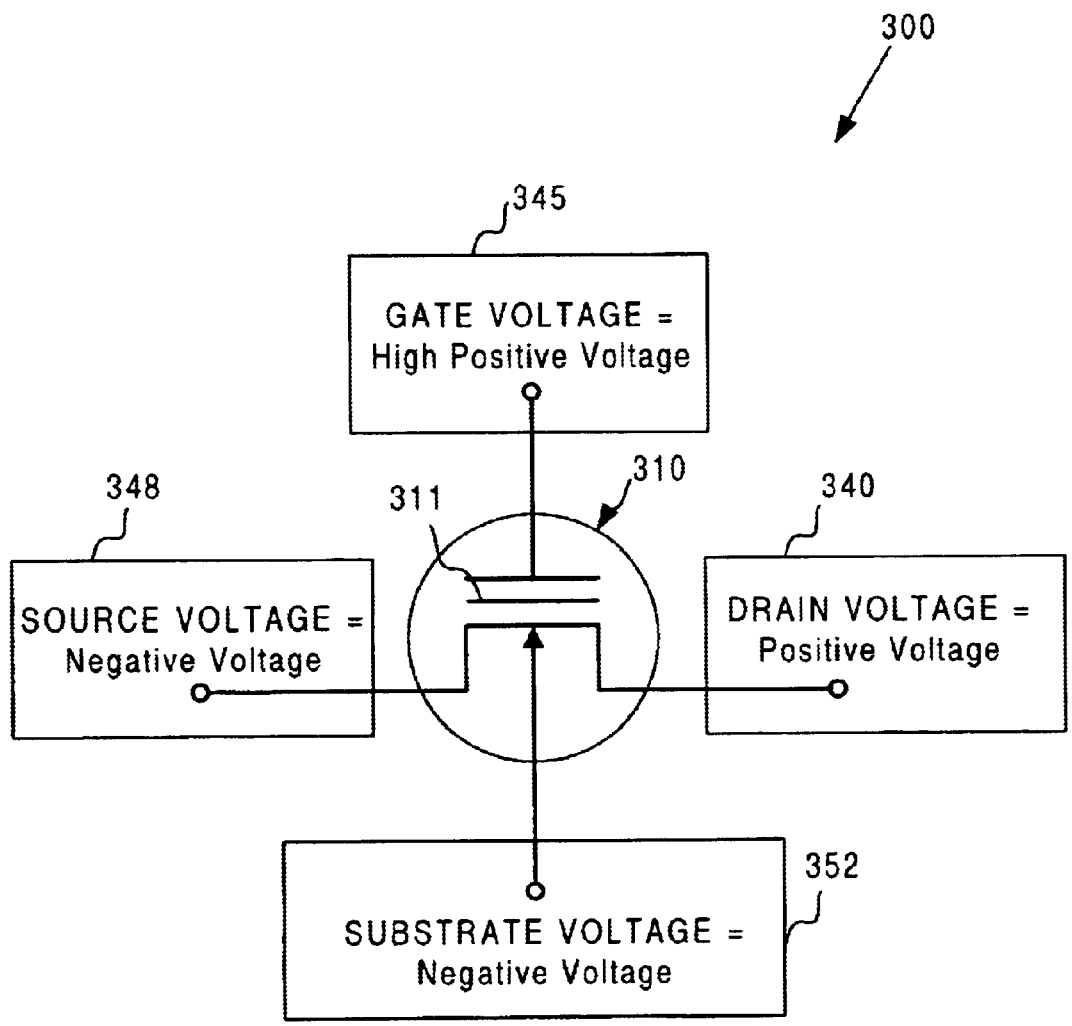
FIG. 3 depicts a circuit configuration for programming a memory in accordance with one embodiment of the present invention.

Turning now to FIG. 3, there is shown circuit configuration 300 for programming target cell 310 according to one embodiment of the present invention. Target cell 310 may, for example, be a flash memory cell having a floating gate 311. In circuit configuration 300, drain voltage 340 is supplied to the drain terminal of target cell 310, and gate voltage 345 is supplied to the gate of target cell 310. As will become apparent by the discussion of the present invention below, the present invention allows drain voltage 340 to be of a relatively moderate magnitude, e.g., 3 V. With the reduced voltage requirements at the drain terminal of target cell 310, the need for large charge pumps and its associated disadvantages can be reduced or eliminated. For example, smaller charge pumps occupying smaller silicon area may be used to provide drain voltage 340. In some cases, the need for charge pumps to supply drain voltage 340 may be eliminated altogether when, for example, drain voltage 340 is about the same as the supply voltage (the supply voltage is not shown in any of the Figures). Moreover, as will further become apparent by the discussion of the present invention below, the present invention allows gate voltage 345 to be a voltage with a magnitude less than or equal to that discussed with respect to the conventional approach discussed above in relation to FIGS. 1 and 2. In one embodiment, gate voltage 345 might be a voltage in the range of about 7.5 to 9 V.

Continuing by reference to FIG. 3, in accordance with the present invention, source voltage 348 supplies a negative voltage to the source terminal of target cell 310, while substrate voltage 352 also supplies a negative voltage to the "substrate" (i.e. the "body") of target cell 310. According to one exemplary embodiment of the present invention, source voltage 348 is a voltage greater than that supplied by substrate voltage 352, where for example, source voltage 348 is a voltage of about −2 V while substrate voltage 352 is a voltage of about −3 V. According to this embodiment and as further discussed below, the appropriate gate, drain, source and substrate voltage levels are achieved in order to program target cell 310. For example, the drain-to-source voltage ($V_{DS}$) in circuit configuration 300 is approximately 5 V, corresponding to the $V_{DS}$ of 5 V in circuit configuration 100. Likewise, even when the gate voltage is about 7.5 V, the gate-to-substrate voltage ($V_{GSUB}$) in circuit configuration 300 is approximately 10.5 V which still exceeds the $V_{GSUB}$ of 9 V in circuit configuration 100. With these voltage levels, programming of target cell 310 can be achieved in a manner similar to that described above in conjunction with FIGS. 1 and 2 without the high drain voltage requirement associated with the conventional approach employed in FIGS. 1 and 2. That is, the $V_{DS}$ of circuit configuration 300 maintains the desired electron flow, while $V_{GSUB}$ of circuit configuration 300 creates an appropriate electron attracting field in the floating gate 311 of the target cell 310 such that rapid charging of floating gate 311 is achieved and target cell 310 is programmed. The present exemplary embodiment of the invention and its related concepts and advantages are further discussed below.

Figure 4:
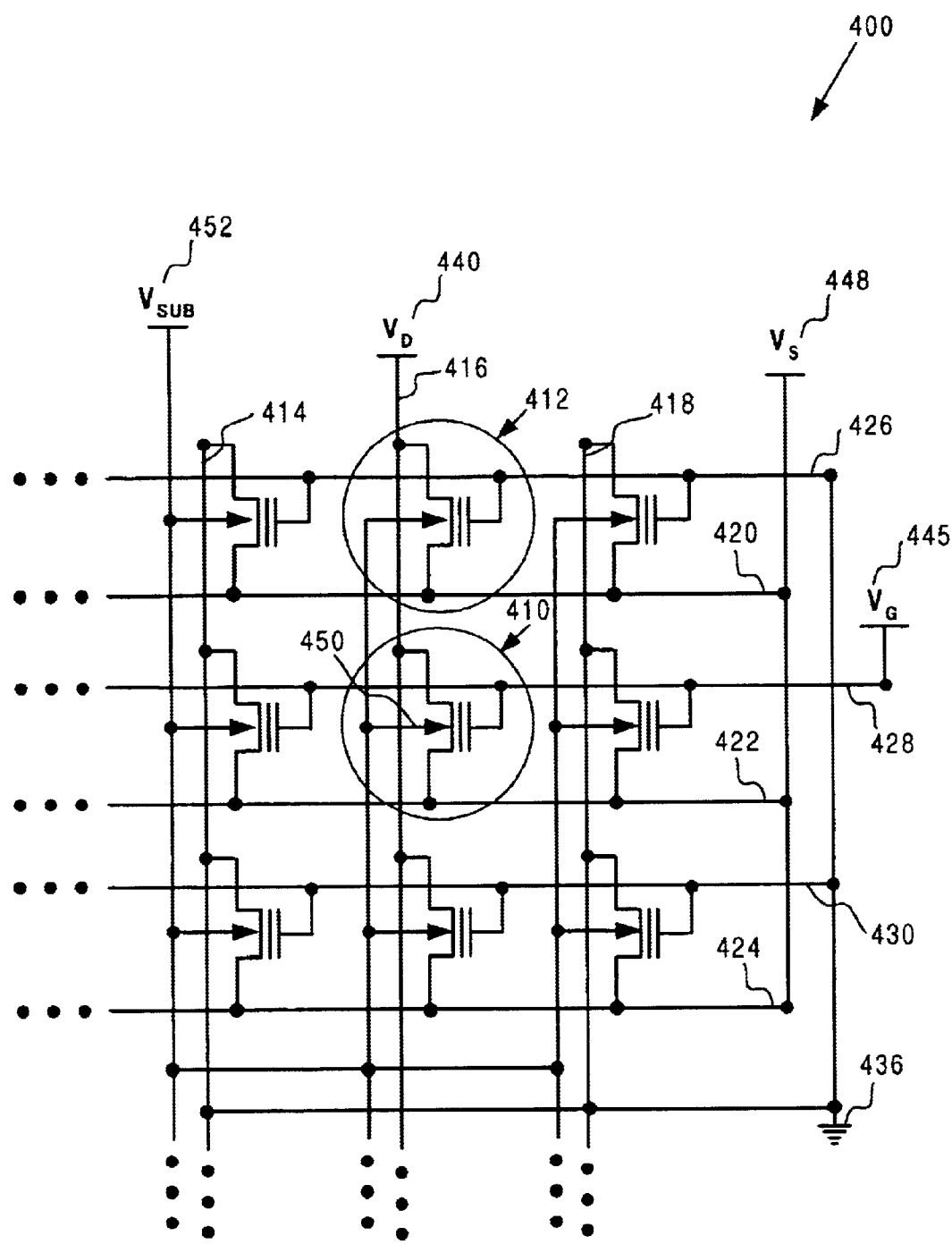
FIG. 4 depicts a schematic of a memory circuit for programming a memory cell in accordance with one embodiment of the present invention.

Referring now to FIG. 4, there is shown a schematic of memory circuit 400 in accordance with one embodiment of the present invention. Memory circuit 400 may be part of a larger memory array which is not shown in FIG. 4. The particular embodiment shown in FIG. 4 and described below relates to a programming operation involving target cell 410 and the particular connections shown in FIG. 4 may be established by appropriate selection circuits which are not shown.

In memory circuit 400, target cell 410 is selected for programming in accordance with circuit configuration 300 described above in conjunction with FIG. 3. As such, memory circuit 400 includes a drain voltage ("$V_D$") 440, a gate voltage ("$V_G$") 445, a source voltage ("$V_S$") 448, and a substrate voltage ("$V_{SUB}$") 452. $V_D$ 440 supplies a positive voltage of a relatively moderate magnitude to the drain terminal of target cell 410 through bit line 416. For example, $V_D$ 440 may supply a voltage of about 3 V. As pointed out above, the reduced voltage requirement at the drain terminal of target cell 310 during programming reduces or eliminates the need for large charge pumps and its associated disadvantages. Thus, smaller charge pumps occupying smaller silicon area may be utilized to supply $V_D$ 440 in some cases. In other cases, the need for charge pumps to supply $V_D$ 440 may be eliminated altogether when, for example, the voltage supplied by $V_D$ 440 is about the same as the supply voltage (the supply voltage is not shown in any of the Figures). $V_G$ 445 supplies a positive voltage with a magnitude less than or equal to that supplied in the conventional approach to the control gate of target cell 410 through word line 428. For example, $V_G$ 445 may supply a voltage in the range of about 7.5 to 9 V. $V_S$ 448 supplies a negative voltage to the source terminal of target cell 410 through line 422. For example, $V_S$ 448 may supply a voltage of about −2 V. In the present embodiment, $V_{SUB}$ 452 supplies a negative voltage with a magnitude less than that supplied by $V_S$ 448 to the substrate of target cell 410 as depicted by connection 450. In the exemplary embodiment of FIG. 4, $V_{SUB}$ 452 may supplies a voltage of about −3 V.

As described above in conjunction with FIG. 3, this particular configuration applied to target cell 410 establishes the appropriate gate, drain, source and substrate voltage levels in order to program target cell 410. For example, the $V_{DS}$s of target cell 410 is approximately 5 V, corresponding to the $V_{DS}$ of 5 V in circuit configuration 100. Likewise, the $V_{GSUB}$ of target cell 410 is approximately 10.5 V, which exceeds the $V_{GSUB}$ of 9 V in circuit configuration 100. Programming of target cell 410 can thus be achieved in a manner similar to that described above without the high drain voltage requirement associated with the conventional approach employed in FIGS. 1 and 2.

Continuing with FIG. 4, the unselected cells of memory circuit 400 are disabled during programming of target cell 410. Thus, word lines 426 and 430 connected to respective gates of the unselected cells are coupled to ground 436; and bit lines 414 and 418 connected to respective drain terminals of the unselected cells are coupled to ground 436. The source terminal of each of the memory cells in memory circuit 400 is connected to $V_S$ 448, and the "substrate" (i.e. the "body") of each of the memory cells in memory circuit 400 is connected to $V_{SUB}$ 452.

Of particular concern are unselected cells in memory circuit 400 which share bit line 416 with target cell 410. Consider, for example, cell 412, which has a drain terminal connected to bit line 416. Since cell 412 shares bit line 416 with target cell 410, current drawn by cell 412 may adversely affect the programming operation involving target cell 410. Thus, in the particular embodiment depicted in FIG. 4, it is desirable to disable cell 412, for example, to reduce current drawn by cell 412 along bit line 416. For purposes of the present application, current drawn by unselected memory cells, which are connected to the target cell along the same bit line, may be referred to as "bit line current leakage."

As previously discussed, in the present exemplary embodiment, $V_{SUB}$ 452 is a negative voltage, e.g., −3 V and moreover, $V_{SUB}$ 452 is less than $V_S$ 448, which itself is a negative voltage, e.g., −2 V. The fact that $V_{SUB}$ 452 is a negative voltage and that it is also lower than the negative voltage at $V_S$ 448 is particularly advantageous in the present embodiment of the invention. For example, the difference between the source and "substrate" (i.e. the "body") voltages of unselected cell 412 causes the threshold voltage of unselected cell 412 to increase due to a physical phenomenon known in the art as the "body effect." Thus, the fact that in the present exemplary embodiment, the difference between $V_{SUB}$ 452 and $V_S$ 448 is 1 volt, increases the threshold voltage of unselected cell 412 from a default value of, for example, 1.5 V to, for example, 2.5 V. As such, the difference between gate and source voltages of unselected cell 412, i.e. the difference between a gate voltage of 0 V and a source voltage of −2 V (i.e. a difference of 2 V), will not be sufficient to turn on unselected cell 412 (having a threshold voltage of 2.5 V) and thus no leakage current would be drawn. Stated differently, the $V_T$ of cell 412 would be at a default value of about 1.5 V when the source and substrate of cell 412 are at the same voltage. In contrast, when the difference between $V_S$ 448 and $V_{SUB}$ 452 is approximately 1 V, as in the case of the present exemplary embodiment, the $V_T$ of cell 412 is increased to, for example, approximately 2.5 V. As a result, the increased $V_T$ in unselected cell 412 exceeds the $V_{GS}$ of cell 412, and thus $V_{GS}$ of cell 412 is not sufficient to activate cell 412. For example, in the exemplary embodiment of FIG. 4, the $V_{GS}$ Of cell 412 is approximately 2 V. However, since the $V_T$ of cell 412 is approximately 2.5 V, $V_{GS}$ of cell 412, being less than $V_T$ of cell 412, is not sufficient to activate cell 412. As a result, unselected cell 412 is disabled, and the bit line current leakage drawn by cell during 412 is substantially reduced or eliminated.

Another advantage of a negative substrate voltage is that a negative substrate voltage applied to target cell 410 results in a more rapid generation of electrons available for programming the floating gate of target cell 410. As a result, the time required to program target cell 410 is considerably reduced. Moreover, according to the exemplary embodiment of the present invention, the difference between gate and substrate voltages of target cell 410 is at least 10.5 V (when the gate voltage is only at 7.5 V while the substrate is at −3 V) which difference is greater than the 9.0 V gate to substrate voltage in conventional programming arrangements discussed in relation to FIGS. 1 and 2. The larger gate to substrate voltage in the present invention produces a larger electric field which further improves the speed and ease of programming target cell 410.

As described above, the various advantages of the present invention are achieved while reducing or eliminating the high drain voltage requirements associated with conventional approaches. Furthermore, programming speed is improved, as noted above, due to a negative substrate bias in target cell 410. Moreover, as discussed above, due to the fact that in the present exemplary embodiment the negative substrate bias is even lower than the negative source voltage, current leakage from unselected cells, such as unselected cell 412 is substantially reduced or entirely eliminated. Therefore, increased reliability and performance in a memory device employing the present invention are achieved.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a memory circuit arrangement for programming a memory cell has been described.

What is claimed is:

1. A memory Circuit for programming a target cell, said memory circuit comprising:

said target cell having a drain terminal connected to a bit line;

a drain voltage coupled to said bit line, said drain voltage being greater than a ground voltage;

a gate voltage coupled to a gale terminal of said target cell, said gate voltage being greater than said ground voltage;

a source voltage coupled to a source terminal of said target cell, said source voltage being less than said ground voltage; and a substrate voltage coupled to a substrate of said target cell, said substrate voltage being less than said ground voltage, wherein said drain voltage, gate voltage, source voltage, and substrate voltage cause electrons to be generated and attracted to a floating gate of said target cell.

2. The memory circuit of claim 1, wherein said substrate voltage is less than said source voltage.

3. The memory circuit of claim 2, further comprising an unselected cell having a drain terminal connected to said bit line, wherein said source voltage is coupled to a source terminal of said unselected cell, wherein a gate terminal of said unselected cell is connected lo ground, wherein said substrate voltage is coupled to a substrate of said unselected cell, thereby causing said threshold voltage of said unselected cell to be greater than a gate-to-source voltage of said unselected cell.

4. The memory circuit of claim 3, wherein said unselected cell does not draw current from said bit line.

5. The memory circuit of claim 1, wherein said drain voltage is approximately 3 volts.

6. The memory circuit of claim 1, wherein said source voltage is approximately −2 volts.

7. The memory circuit of claim 1, wherein said substrate voltage is approximately −3 volts.

8. A memory circuit for programming a target cell, said memory circuit comprising:

target memory means for storing at least one bit, said target memory means comprising said target cell having a drain terminal connected to a bit line;

first voltage means for supplying a drain voltage, said drain voltage coupled to said bit line, said drain voltage being greater than a ground voltage second voltage means for supplying a gale voltage, said gate voltage coupled to a gate terminal of said target cell, said gate voltage being greater than said ground voltage;

third voltage means for supplying a source voltage, said source voltage coupled to a source terminal of said target cell, said source voltage being less than said ground voltage; and fourth voltage means for supplying a substrate voltage, said substrate voltage coupled to a substrate of said target cell, said substrate voltage being less than said ground voltage, wherein said drain voltage, gate voltage, source voltage, and substrate voltage cause electrons to be generated and attracted to a floating gate of said target cell.

9. The memory circuit of claim 8, wherein said substrate voltage is less than said source voltage.

10. The memory circuit of claim 9, further comprising an unselected cell having a drain terminal connected to said bit line, wherein said source voltage is coupled to a source terminal of said unselected cell, wherein a gate terminal of said unselected cell is connected to ground, wherein said substrate voltage is coupled to a substrate of said unselected cell, thereby causing said threshold voltage of said unselected cell to be greater than a gate-to-source voltage of said unselected cell.

11. The memory circuit of claim 10, wherein said unselected cell does not draw current from said bit line.

12. The memory circuit of claim 8, wherein said drain voltage is approximately 3 volts.

13. The memory circuit of claim 8, wherein said source voltage is approximately −2 volts.

14. The memory circuit of claim 8, wherein said substrate voltage is approximately −3 volts.

15. A memory circuit for programming a target cell, wherein said target cell has a drain terminal connected to a bit line, a drain voltage is coupled to said bit line and said drain voltage is greater than a ground voltage; and wherein a gate voltage is coupled to a gate terminal of said target cell, said gate voltage is greater than said ground voltage and a source voltage is coupled to a source terminal of said target cell; and further wherein a substrate voltage is coupled to a substrate of said target cell, said memory circuit being characterized in that:

said source voltage is less than said ground voltage and said substrate voltage is less than said ground voltage, wherein said drain voltage, gate voltage, source voltage, and substrate voltage cause electrons to be generated and attracted to a floating gate of said target cell.

16. The memory circuit of claim 15, wherein said substrate voltage is less than said source voltage.

17. The memory circuit of claim 16, further comprising an unselected cell having a drain terminal connected to said bit line, wherein said source voltage is coupled to a source terminal of said unselected cell, wherein a gate terminal of said unselected cell is connected to ground, wherein said substrate voltage is coupled to a substrate of said unselected cell, thereby causing said threshold voltage of said unselected cell to be greater than a gate-to-source voltage of said unselected cell.

18. The memory circuit of claim 17, wherein said unselected cell does not draw current from said bit line.

19. The memory circuit of claim 15, wherein said source voltage is approximately −2 volts.

20. The memory circuit of claim 15, wherein said substrate voltage is approximately −3 volts.

* * * * *